US005646068A

United States Patent [19]
Wilson et al.

[11] Patent Number: 5,646,068
[45] Date of Patent: Jul. 8, 1997

[54] SOLDER BUMP TRANSFER FOR MICROELECTRONICS PACKAGING AND ASSEMBLY

[75] Inventors: Arthur M. Wilson; Mark A. Kressley, both of Richardson, Tex.; Dean L. Frew, Springfield, Va.; Juanita G. Miller, Richardson, Tex.; John E. Hanicak, Plano, Tex.; Philip E. Hecker, Garland, Tex.; James M. Drumm, Crystal Lake, Ill.

[73] Assignee: Texas Instruments Incorporated, Dallas, Tex.

[21] Appl. No.: 384,506

[22] Filed: Feb. 3, 1995

[51] Int. Cl.$^6$ .................................................. H01L 21/44
[52] U.S. Cl. .......................... 437/183; 437/187; 437/203; 437/208; 437/209
[58] Field of Search .................................. 437/183, 187, 437/188, 189, 203, 208, 209

[56] References Cited

U.S. PATENT DOCUMENTS

| | | | |
|---|---|---|---|
| 4,890,157 | 12/1989 | Wilson . | |
| 4,927,491 | 5/1990 | Masaki | 437/206 |
| 5,053,357 | 10/1991 | Lin et al. | 437/204 |
| 5,309,021 | 5/1994 | Shimamoto et al. | 257/691 |
| 5,397,747 | 3/1995 | Angiulli et al. | 437/209 |
| 5,478,778 | 12/1995 | Tanisawa | 437/183 |
| 5,498,575 | 3/1996 | Onishi et al. | 437/209 |

*Primary Examiner*—Kevin Picardat
*Attorney, Agent, or Firm*—René E. Grossman; Richard L. Donaldson; Jay M. Cantor

[57] ABSTRACT

A method of making a microelectronic circuit and the connection pattern therefor including the steps of providing a substrate (3), preferably silicon and preferably including a layer of nickel (38) under a layer of gold (36) thereon. Regions are formed on the substrate for connection of electrical components to the substrate using a first metallurgy, preferably gold and a pattern of bumps (5, 7) is formed of a second metallurgy different from the first metallurgy, preferably lead/tin solder. An interconnection pattern is formed on the substrate contacting at least one bump and at least one pad. The pattern of solder bumps is formed by providing a coupon (31) and patterning the bumps on the coupon and applied to the substrate while attached to the coupon, then heated to cause flow of the bumps onto the substrate. The coupon is then removed from the bumps with the bumps remaining on the substrate. Electrical components are applied to the region of first metallurgy and electrically bonded by wire bonding or Tape Automated Bonding techniques. Electrical components are applied to the region of the second metallurgy and electrically bonded by flip-chip technique.

24 Claims, 3 Drawing Sheets

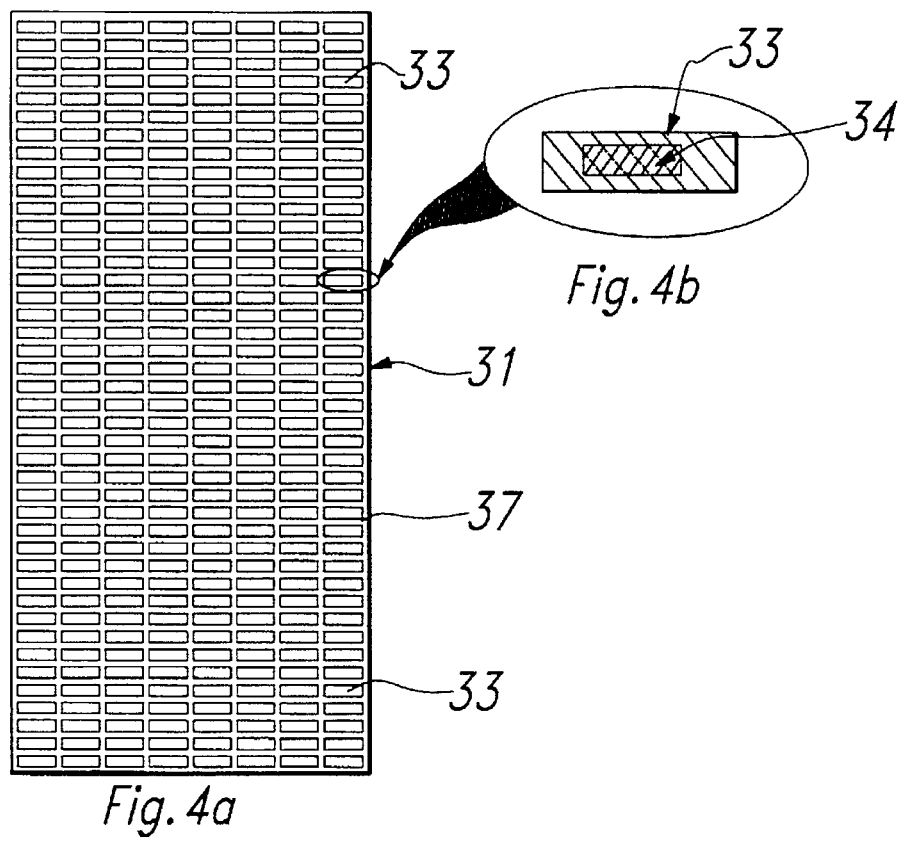
Fig. 4a
Fig. 4b
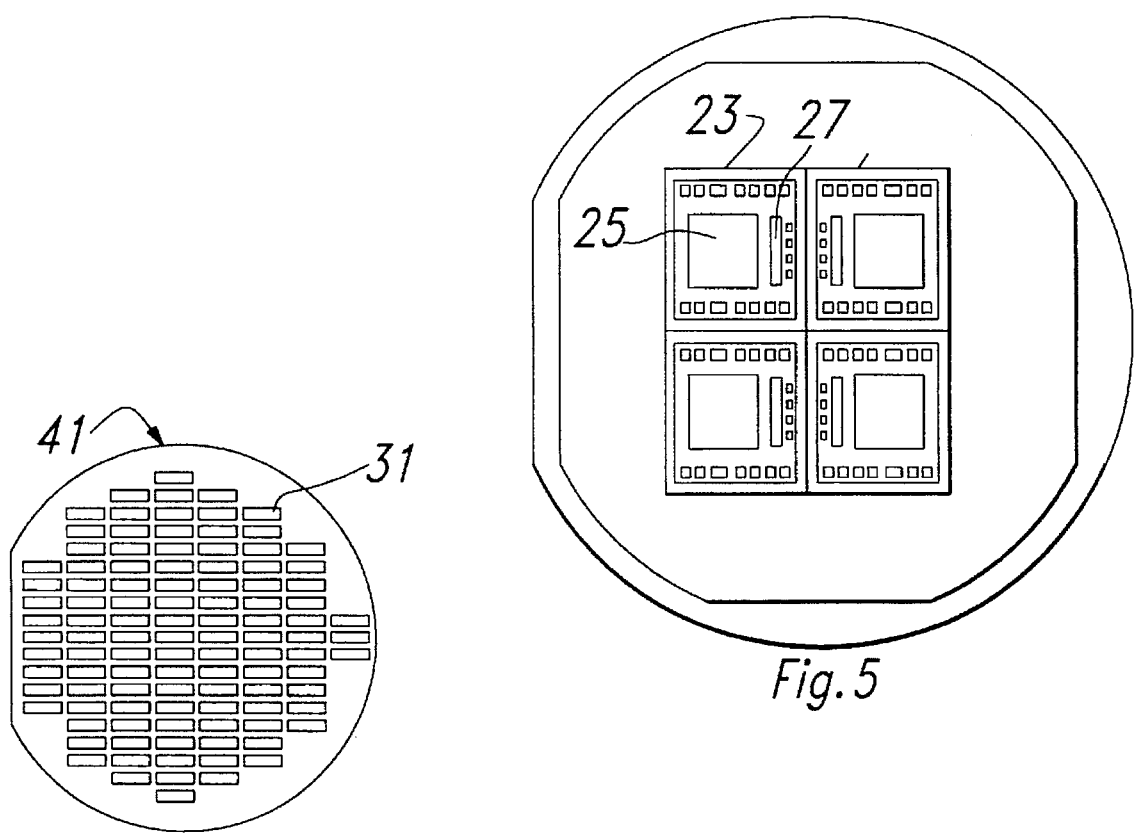
Fig. 5
Fig. 6

SOLDER BUMP TRANSFER FOR MICROELECTRONICS PACKAGING AND ASSEMBLY

BACKGROUND OF THE INVENTION

1. Field of the Invention

This invention relates to the formation of microelectronic circuits and, more specifically, to the method of forming interconnection regions on a substrate and the method of fabricating the microelectronic circuit.

2. Brief Description of the Art

Interconnect top metal systems for use in conjunction with the formation of multicomponent modules (MCMs) have generally been limited to a single metal finish. Printed circuit boards typically provide either copper, tin/lead solder, tin/nickel or gold. Military and high reliability circuits usually insist on gold as a finish surface over a nickel barrier and a chromium adhesion layer. Commercial multicomponent modules use aluminum as the thin film conductor and usually leave the aluminum as the pad metal to which gold wire bonds are stitched. Solder coated and gold coated pads are not generally produced on the same interconnect circuit board because fabrication costs are high and contamination of the gold pads with solder results in brittle gold-tin intermetallics that can be highly resistive.

In the packaging of bare semiconductor dice on interconnects by the technique known as MCM assembly, it is advantageous to be able to use tested dice that are known to be electrically sound and of known reliability. This assures the manufacturer of high yields and the customers of a reliable system. Reliable testing of individual die presently requires some form of bonding to a reusable lead frame, e.g., TAB or solder ball or C4 flip-chip bonding to a reusable test interconnect. These known good die (KGD) technologies are particularly suitable for systems requiring the highest reliability, i.e., military and space systems. When other techniques become available to provide KGD without additional processing, the bare die can be attached with the more traditional wire bonding techniques. In order to take advantage of these various joining techniques, bonding sites on the interconnect must be of the correct metallurgy. Presently, interconnect top metal systems provide metallurgical joints and dice for either TAB or flip-chip technologies, but both are not used on the same interconnect.

Flip-chip technology has been practiced by creating the solder bump on the die. No prior technology has provided solder bumps as high as 75 to 100 microns in diameter on an interconnect metal pad. Plating of solder is a means to provide bumps of this diameter. However, arrays of solder bumps plated in an irregular pattern on a field creates bumps of very non-uniform volume and composition.

Gold bumps on the die and interconnect are usually electro-plated. Although the plating baths are designed to control the grain size and the hardness of these bumps, the hardness is usually very variable and ranges too high. Thus, the bumps must be annealed after plating to reduce the hardness and the variability. If the flip-chip solder is to be placed on the interconnect along with gold bumps for TAB, the gold bumps must be annealed before the solder is deposited.

Small solder bumps can be deposited by evaporation of tin and lead through pre-aligned shadow masks. This is the method of choice as described by the prior art to deposit solder bumps on flip-chip dice, but is capital intensive and very costly. Also, the evaporation technique deposits the metal in a non-selective manner. The shadow masks collect the excess solder and must be cleaned after each evaporation run. This by-product stream is a hazardous waste that requires costly disposal. Cleaning after every deposition run requires duplicate shadow mask tooling and high labor cost for its maintenance.

SUMMARY OF THE INVENTION

In accordance with the present invention, the above noted deficiencies of the prior art are minimized.

Briefly, there is provided a microelectronic circuit to which two or more components are electrically joined by different, somewhat incompatible, metallurgies wherein at least one component is joined by means of, for example, solder and at least one component is joined by, for example, gold wire bonding, TAB bonding and/or conductive adhesive. There is also provided a solder transfer coupon with uniform solder bumps dimensionally arrayed so that they can be transferred directly to the receiving pads on the microelectronic circuit.

A coupon is formed for transfer of solder bumps of the second type of metallurgy to the region of the microelectronic circuit surface designated for reception of components using that type of metallurgy. This is accomplished by providing a temporary substrate material that matches the linear coefficient of thermal expansion of the substrate of the microelectronic circuit, preferably silicon, and a non-solder wettable layer, preferably silicon oxide. In addition a seed metal is deposited on the temporary substrate which provides (1) high adhesion to the non-solder wettable layer, (2) high electrical conductivity, (3) can be selectively etched and (4) is soluble in molten solder, preferably copper. A mask of the appropriate solder bump pattern is then placed over the temporary substrate plus the seed metal. The solder bumps are formed on the temporary substrate/seed metal by appropriate deposition methods, for example electro-plating, solder jet, screen printing, etc. The mask is then removed and the solder bumps and underlying seed pads are then isolated from one another by preferentially etching the exposed seed metal, with solder bumps acting as the etch mask.

The microelectronic circuit is fabricated on a substrate, the material of which is chosen so the linear coefficient of thermal expansion of the substrate and the components to be mounted thereon are equivalent. For example the substrate material of choice for silicon integrated circuits would be silicon. Regions on the microelectronic circuit have been designated for reception of components utilizing the first type of metallurgy for bonding (e.g., gold) and other regions on that surface have been designated for reception of components utilizing a second type of metallurgy for bonding (e.g. Pb/Sn solder). The region utilizing the first type of metallurgy has bond pads formed on the surface of the microelectronic circuit by standard techniques, i.e., electro-plating in the regions designated for that type of metallurgy. The substrate can then go through an anneal process to soften the bumps to a uniform hardness prior to transferring the second metallurgy to the substrate. The region of the microelectronic circuit utilizing the second metallurgy is coated with a layer of a solder wettable barrier metal, for example nickel, having a very thin coating of a metal soluble in molten solder thereon, for example, gold. The transfer coupon comprising the temporary substrate with seed metal pads and solder bump pattern thereon is then positioned over the substrate in proper location and the substrate and bumps on the temporary substrate are heated sufficiently to cause the solder forming the bumps to dissolve the seed metal pads and reflow onto the microelectronic substrate, melting the thin soluble metal coating and wetting to the barrier metal pad thereon. The bumps remain on the substrate after cooling to the solid state and the temporary substrate of the transfer coupon is removed and discarded.

Components requiring the first metallurgy are now bonded in a standard manner to the pads of that metallurgy, preferably gold. Components requiring the second metallurgy are secured to the solder bumps by first placing a highly viscous flux over the solder bumps, placing the pads or leads from the component over the bumps with the component being held in place by the flux and then heating the solder so that the solder reflows along the pads or leads of the component to provide the connection. Final packaging of the resultant multicomponent module is accomplished according to standard practice, depending upon the application of the electrical system.

BRIEF DESCRIPTION OF THE DRAWINGS.

FIG. 4a is an enlargement of a solder transfer coupon in accordance with the present invention;

FIG. 4b is an enlargement of solder bump 33, showing the seed metal 34 underneath;

FIG. 5 is an array of four thin film circuits of the type described with reference to FIG. 3;

FIG. 6 is an array of solder coupons of FIG. 4 on a wafer;

FIG. 3, before the solder bumps are transferred.

DESCRIPTION OF THE PREFERRED EMBODIMENT

Figure 1:
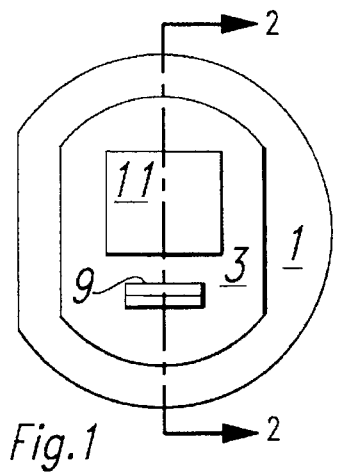
FIG. 1 is a simplified microelectronic circuit which can be fabricated in accordance with the present invention.
Figure 2:
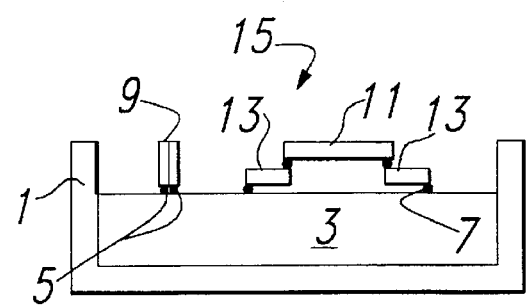
FIG. 2 is the circuit of FIG. 1 taken along the line 2—2 of FIG. 1.

Referring first to FIGS. 1 and 2, there is shown a simplified microelectronic circuit 15 that can be fabricated by the prior art or in accordance with the present invention. Microelectronic circuits of this type presented the problem of plating uniformity as described hereinabove. A multilevel metal interconnect pattern composed of, for example, aluminum leads and polyimide dielectrics (not shown, but described in U.S. Pat. No. 4,890,157) is disposed on the surface of the substrate 3 within a housing 1. Bumps 5 and 7 are disposed on top of this multilevel interconnect pattern for connection to pads and/or bumps on semiconductor components 9 and 11. As shown in FIGS. 1 and 2, the bumps 5 and 7 are of different metallurgy, the bumps 5 being, for example, solder (e.g. 37% Pb/63% Sn), the component 9 connected thereto being, for example, a pair of memory components, the bumps 7 being, for example, gold plated nickel and the component 11 connected thereto by gold leads 13 being, for example, a processor component. The components 9 are connected to the solder bumps 5 by forming the bumps, heating the substrate and placing a flux over the bumps, the flux holding the components 9 temporarily in position with the leads thereon over the solder bumps. Reflow of the solder along the leads takes place after heating the solder to the flow temperature to provide the fillets. The bumps 5 and 7 can be connected to the interconnect pattern of the substrate 3 to provide electrical interconnection between the components 9 and 11 and provide a circuit path for connection external to the microelectronic circuit 15. The components 9 and 11 will have been tested prior to connection to the substrate 3.

Figure 3:
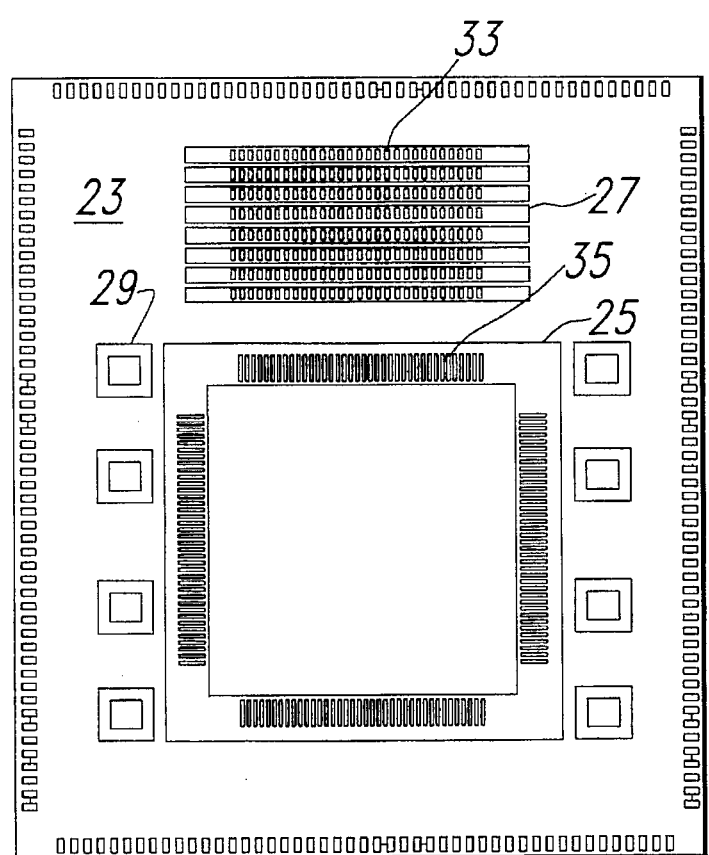
FIG. 3 is a diagram of the top metal pads and bumps (after transfer) used for assembling a signal processing system in the form of a multicomponent module in accordance with the present invention.

Referring to FIG. 3, there is shown a diagram of the top metal pads and bumps used for assembling a signal processing system in the form of a multicomponent module, interconnects not being shown. The processing system includes the metal can 21 with a silicon substrate 23 therein as in FIGS. 1 and 2. The electrical function provided is a large cache memory with a digital signal processor (DSP), i.e., a unit building block of a microcomputer. The packaging function of the processing system takes one DSP which will be coupled to the pads 35 in the region 25, eight SRAMs which will be coupled to the bumps 33 in the region 27 and eight filter capacitors 29, with a total pin count of 621 and reduces this pin count to 172 active pins in a 196 pin grid array (PGA) or a 196 pin quad flat pack (QFP). An 80 to 90 percent area reduction is achieved by this single package over the seventeen individual packages on a conventional system motherboard. A significant portion of the area reduction is accomplished by the 3-dimensional (3D) stacking of the eight SRAMs and the electrical/mechanical bonding of the stack to the thin film circuit board by soldering the TAB leads projecting from the stack as described in U.S. Pat. No. 5,327,327 and elsewhere in the prior art, to the solder bumps 33 in the area 27 in FIG. 3.

Figure 7:
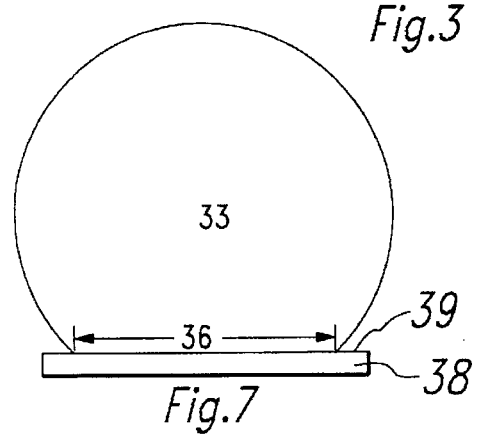
FIG. 7 is a cross section showing the wetting limit of solder on nickel due to the native oxide grown outside area 36.
Figures 8A, 8B:
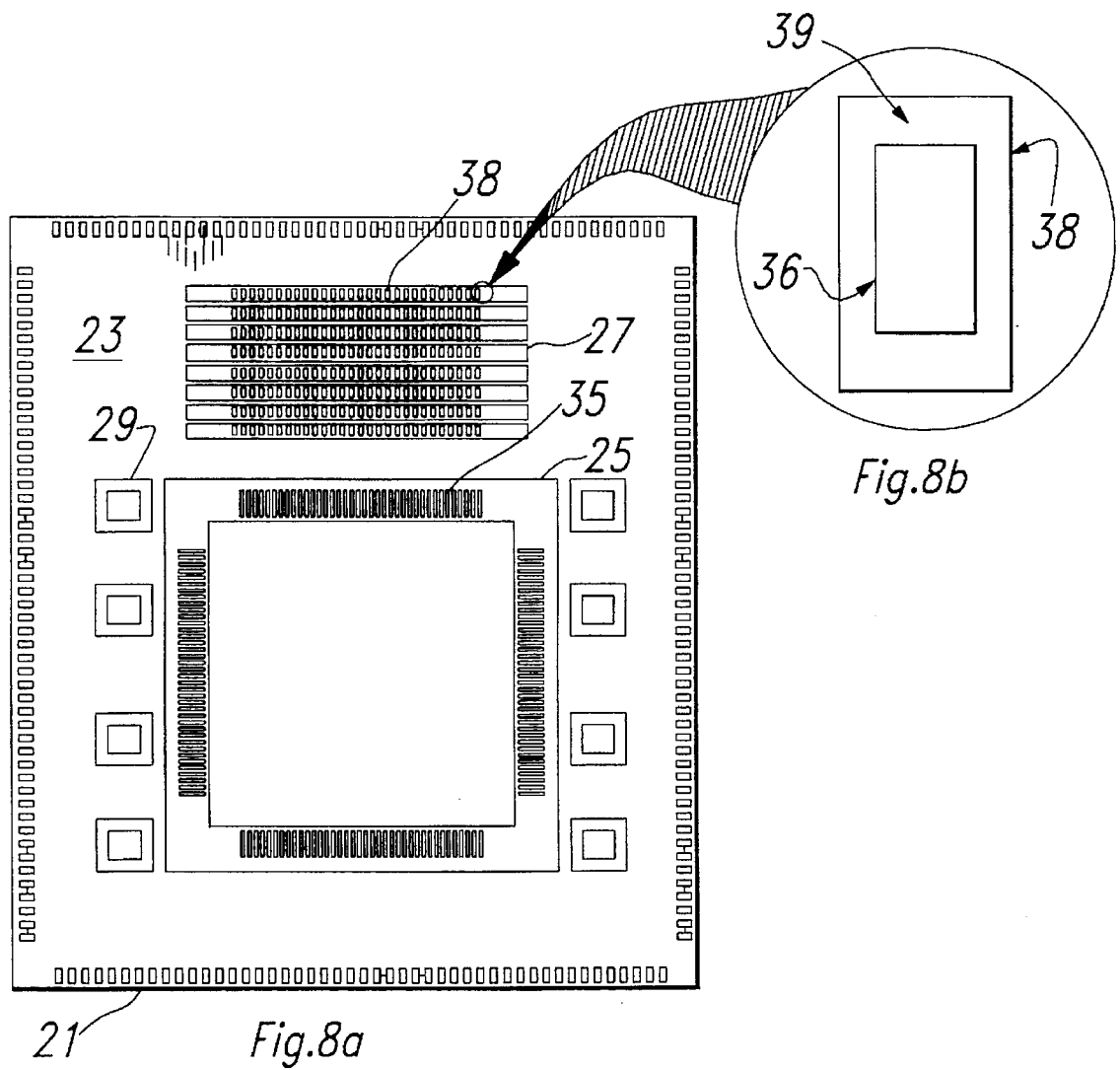
FIG. 8a is a diagram of the top metal pads and the bump receiving pads, i.e.
FIG. 8b is an enlargement of one nickel receiving pad 38 with a nested protective noble metal film on top 36.

FIG. 4a is an enlargement of a solder transfer coupon 31 which is used to place the solder bumps 33 on the substrate 23 of FIG. 8a in the region 27 for the 3-D memory array. The coupon 31 is of the same material as the substrate 23 of FIG. 8a, preferably silicon with a silicon oxide release layer 37. The solder bumps 33 and their seed metal pads 34 (refer to FIG. 4b), preferably copper, are created on the coupon 31 by providing a mask having a pattern of apertures over the coupon plus the field seed metal and then forming the bumps through the holes by plating, removing the plating mask and using the solder bumps to mask the seed metal during the etch of the exposed seed metal. The unexposed seed metal 34 which remains must perform the functions of providing adhesion to the silicon oxide 37 and dissolving in the solder at the reflow temperatures. Copper performs these two functions well. Thus, the solder remains attached to the transfer coupon 31 until the solder becomes molten, dissolves the copper pad 34 and is released from the surface oxide of the coupon 37. The solder bumps 33 will be of uniform height and composition. The substrate 23 in FIG. 8a has a thin surface layer of a noble metal 36, preferably gold coated on nickel 38 thereon as shown in FIG. 8b. The function of the gold 36 is to prevent the nickel 38 from being oxidized and maintains its wettability by solder. As shown in FIG. 8b, the gold 36 is patterned with a border of exposed nickel 38. This exposed nickel acquires a native oxide layer 39 which is non-wettable by solder. This ring of nickel oxide 39 on the pad area 36 becomes a barrier which contains the solder bump 33 as shown in FIG. 7.

Thus, the transfer of the solder from the pads 34 of coupon 31 to the pad areas 36 of the multichip substrate 23 involves a series of time and temperature steps. The solder bumps 33 on coupon 31 will be picked and placed in the region designated for memory components 27 of substrate 23. The substrate is maintained at 150° C. so that a pre-applied layer of solder flux remains tacky. This tacky flux maintains the alignment of the transfer coupon 31 to the substrate 23 when the pick and place tool is removed. The applied temperature of the substrate is then raised through the eutectic temperature of solder, 183° C., to a peak temperature of 190° to 195° C. before it is cooled to less than 160° C. When the solder becomes liquid, the solder wets the gold film 36 on the nickel pad 38 of the multichip substrate 23. At this point, even if the transfer coupon 31 is slightly misaligned relative to the nickel pads 38 of the multichip substrate 23, the transfer coupon self aligns due to the surface tension of the solder attached to pad sites 36 on substrate 23 and pad site 34 on coupon 31. During the time the solder remains above the melting point, the copper pad 34 dissolves and frees the solder from attachment to the transfer coupon 31. Also, during this period of time, the gold film 36 dissolves and the solder wets to the underlying nickel surface, completing the transfer of the solder from coupon 31 to multichip substrate 23. After the solder cools to the solid state, the coupon 31 is removed and discarded. The gold pads for connection of the processor will already have been formed on the substrate 23. Accordingly, the substrate 23 will now have both gold pads and solder bumps thereon of different metallurgy and of good quality to minimize rejects during fabrication.

FIG. 5 shows an array of four thin film circuits 23 of the type described with reference to FIG. 8a on, for example, a 125 mm wafer. The isolation of the 3D memory array area 27 is apparent from this figure, the memory array being 8.3 percent of the total area of the thin film circuit and on the 125 mm wafer it takes up less area. In FIG. 6, the solder transfer coupons 31 are arrayed so that 106 solder transfer coupons take up almost 100 percent of the area of the 125 mm wafer. The bumps from the solder coupon are transferred to the regions 27 whereas the gold bumps for the processor component will be formed in the regions 25.

By placing the solder from a plating bath of appropriate composition directly onto an appropriately masked wafer in the configuration of FIG. 5, the isolation of the solder arrays would cause serious non-uniformity in the individual solder bumps of each array. The individual bumps of the edge rows and columns of the 8 ×35 array would plate higher than the interior individual bumps of the other 6 rows and 33 columns. Also, the corner four bumps plate higher than the interior bumps of the edge rows and columns. Because more solder deposits per unit area in a unit of time, the corner bumps and other edge row and column bumps are said to have a "higher current density". Because the edge rows and columns of bumps are drawing a larger fraction of the current, they are diverting current from the interior bumps. This inequitable distribution of material deposition is caused by poor transport of electrochemically active species of tin and lead from the bulk of the plating bath to the surface of the individual electrodes where the alloy is deposited. The interior bumps have eight neighbors competing for the supply of tin and lead whereas the external bumps have only five nearest neighbors and the corner bumps have merely three nearest neighbors. The bumps grow at rates approximately inversely proportional to the number of nearest neighbors.

FIG. 6 is an array of 106 solder coupons 31 on a wafer 41. All bumps of all interior dice have nearly eight equally spaced neighbor bumps to compete with for electrochemically active tin and lead. Once again, the edge bumps of each die are spaced farther from the neighbor bumps in adjacent dice by the saw kurf space. The external space versus the internal space upsets the uniformity of bump dimension by less than 5 percent for middle and 10 percent for corner external bumps. The bumps of the external dice on the wafer plate faster than bumps of the internal dice. When the internal dice bumps are plated 25 to 30 microns above the mask, the bumps of the external dice bridge the 100 micron gap and short circuit.

Compositional non-uniformity is a second undesired result of plating a tin-lead alloy on a wafer with separated arrays as in FIG. 5. If the solder is plated at the same bath composition and current densities, a much more uniform tin-lead composition is achieved across a FIG. 6 array than across a FIG. 5 array. Eutectic solder (63% tin-37% lead) is plated with standard deviations of ±1.5% to ±2.0% tin across all bumps of the internal coupons. The compositional standard deviation across individual die of FIG. 5 is typically no better than ±5%. The wafer 41 will be diced to form individual solder coupons 31 that can be examined individually and sorted for uniformity and composition. Those that meet the requirements will be used and the rest discarded.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of making a microelectronic circuit comprising the steps of:
   (a) providing a substrate;
   (b) forming regions on said substrate for connection of electrical components to said substrate using a first metallurgy;
   (c) forming a pattern of bumps of a second metallurgy different from said first metallurgy on a coupon; and
   (d) applying said bumps from said coupon to said substrate.

2. The method of claim 1 further including the step of forming an interconnection pattern on said substrate contacting at least one said bump and said second metallurgy.

3. The method of claim 2 wherein said substrate is silicon.

4. The method of claim 1 wherein said substrate includes a layer of nickel thereon and a layer of gold over said nickel.

5. The method of claim 2 wherein said substrate includes a layer of nickel thereon and a layer of gold over said nickel.

6. The method of claim 3 wherein said substrate includes a layer of nickel thereon and a layer of gold over said nickel.

7. The method of claim 1 wherein said first metallurgy is gold and said second metallurgy is a lead/tin solder.

8. The method of claim 6 wherein said first metallurgy is gold and said second metallurgy is a lead/tin solder.

9. The method of claim 1 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

10. The method of claim 2 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

11. The method of claim 3 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

12. The method of claim 4 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

13. The method of claim 5 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

14. The method of claim 6 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

15. The method of claim 7 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

16. The method of claim 8 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

17. The method of claim 1 further including the step of connecting electrical components to said regions for connection and to said bumps.

18. The method of claim 16 further including the step of connecting electrical components to said regions for connection and to said bumps.

19. A method of making a microelectronic circuit comprising the steps of:
    (a) providing a housing and a substrate within said housing;
    (b) forming regions on said substrate for connection of electrical components to said substrate using a first metallurgy;
    (c) forming a pattern of bumps of a second metallurgy different from said first metallurgy on a coupon;
    (d) applying said bumps from said coupon to said substrate; and
    (e) connecting electrical components to said first regions for connection and to said bumps.

20. The method of claim 19 further including the step of forming an interconnection pattern on said substrate contacting at least one said bump and said first metallurgy.

21. The method of claim 20 wherein said substrate is silicon and includes a layer of nickel thereon and a layer of gold over said nickel.

22. The method of claim 21 wherein said first metallurgy is gold and said second metallurgy is a lead/tin solder.

23. The method of claim 19 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

24. The method of claim 22 wherein step (c) includes the steps of providing a coupon and patterning said bumps on said coupon and step (d) includes the steps of applying said bumps while attached to said coupon to said substrate, then heating said bumps to cause flow of said bumps onto said substrate and then removing said coupon from said bumps with said bumps remaining on said substrate.

* * * * *